United States Patent
Jo et al.

(10) Patent No.: US 9,029,248 B2
(45) Date of Patent: May 12, 2015

(54) METHOD OF FABRICATING AG-DOPED TE-BASED NANO-MATERIAL AND MEMORY DEVICE USING THE SAME

(75) Inventors: William Jo, Seoul (KR); Ah-Reum Jeong, Seoul (KR)

(73) Assignee: EWHA University-Industry Collaboration Foundation (KR)

( * ) Notice: Subject to any disclaimer, the term of this patent is extended or adjusted under 35 U.S.C. 154(b) by 294 days.

(21) Appl. No.: 12/937,182

(22) PCT Filed: Oct. 30, 2008

(86) PCT No.: PCT/KR2008/006402
§ 371 (c)(1),
(2), (4) Date: Oct. 8, 2010

(87) PCT Pub. No.: WO2009/125904
PCT Pub. Date: Oct. 15, 2009

(65) Prior Publication Data
US 2011/0024715 A1    Feb. 3, 2011

(30) Foreign Application Priority Data
Apr. 8, 2008    (KR) .................. 10-2008-0032592

(51) Int. Cl.
*H01L 45/00* (2006.01)
*G11C 13/00* (2006.01)
*B82Y 10/00* (2011.01)
*B82Y 30/00* (2011.01)

(52) U.S. Cl.
CPC ............. *G11C 13/0011* (2013.01); *B82Y 10/00* (2013.01); *B82Y 30/00* (2013.01); *H01L 45/085* (2013.01); *H01L 45/1233* (2013.01); *H01L 45/1266* (2013.01); *H01L 45/144* (2013.01); *H01L 45/1641* (2013.01); *H01L 45/14* (2013.01); *H01L 45/141* (2013.01); *H01L 45/1625* (2013.01); *Y10S 977/943* (2013.01); *Y10S 977/81* (2013.01); *Y10S 977/89* (2013.01)

(58) Field of Classification Search
CPC ................... H01L 21/02485; H01L 31/0324; H01L 21/02417; H01L 45/141
USPC ..................................... 438/46; 257/191, 188
See application file for complete search history.

(56) References Cited

U.S. PATENT DOCUMENTS

| | | | |
|---|---|---|---|
| 6,646,902 B2 * | 11/2003 | Gilton et al. ................... | 365/100 |
| 7,265,373 B2 * | 9/2007 | Wang et al. ....................... | 257/4 |
| 7,425,720 B2 * | 9/2008 | Kaeriyama et al. ............... | 257/4 |
| 7,655,497 B1 * | 2/2010 | Yu et al. ........................... | 438/95 |
| 7,787,279 B2 * | 8/2010 | Happ et al. ..................... | 365/148 |
| 2006/0063361 A1 | 3/2006 | Kumar et al. | |
| 2007/0285148 A1 * | 12/2007 | Sakamoto et al. ............. | 327/365 |

OTHER PUBLICATIONS

Jitka Sramkova et al., "Precision attainable in the determination of silver by flame atomic absorption spectrometry Analysis of thermoelectric silver-doped tellurides," Analytica Chimica Acta (Mar. 9, 2000) pp. 183-190, vol. 408, Elsevier, Netherlands.

(Continued)

*Primary Examiner* — Kenneth Parker
*Assistant Examiner* — Bo Fan

(57) ABSTRACT

A nano-ionic memory device is provided. The memory device includes a substrate, a chemically inactive lower electrode provided on the substrate, a solid electrolyte layer provided on the lower electrode and including a silver (Ag)-doped telluride (Te)-based nano-material, and an oxidizable upper electrode provided on the electrolyte layer.

10 Claims, 3 Drawing Sheets

(56) References Cited

OTHER PUBLICATIONS

PCT International Searching Authority, "Written Opinion," PCT/KR2008/006402 (May 11, 2009).

Jiaqing Xu et al., "Crystallization and C-RAM application of Ag-doped Sb2Te3 material," Materials Science and Engineering B, vol. 127 (2006), pp. 228-232, 2005.

* cited by examiner

METHOD OF FABRICATING AG-DOPED TE-BASED NANO-MATERIAL AND MEMORY DEVICE USING THE SAME

TECHNICAL FIELD

The present invention relates to a memory device, and more particularly, to a nano-ionic memory device including a silver (Ag)-doped telluride (Te)-based nano-material.

BACKGROUND ART

A semiconductor memory device typically contains a plurality of memory cells, and a cell field formed in a matrix of row lines and column lines or word lines and bit lines. Actual memory cells are disposed at intersections of feed lines formed of a conductive material. The row lines and column lines or the word lines and bit lines are respectively connected electrically to memory cells through an upper electrode and a lower electrode. In order to change the data content in a certain memory cell at an addressing intersection, or in order to access the data of a memory cell, a corresponding word line and bit line are selected, and a write current or a read current is supplied. For this end, the word lines and bit lines are controlled by a corresponding control device.

Many types of semiconductor memories, such as a random access memory (RAM) that includes a plurality of memory cells each having one capacitor connected to a select transistor, are publicly known. By selectively applying a voltage through a column line and a row line to a corresponding select transistor, electrical charges are stored in data units (bits) in a capacitor during a write process and are re-accessed through the select transistor during a read process. Because a RAM device is the random access memory, data can be stored at a specific address and can later be read at the same address.

Another type of semiconductor memory is a dynamic RAM (DRAM) that generally includes only a single capacitive device correspondingly controlled, for example, a trench capacitor. Through the capacitance of the trench capacitor, individual bits can be respectively stored as charges. However, because stored charges can be retained for relatively short periods of time within a DRAM cell, a refresh must be performed every 64 ms (for example). That is, data content must be re-written in a memory cell.

In contrast, each cell of a static RAM (SRAM) generally includes a plurality of transistors. As opposed to the DRAM, there is no need to perform a refresh in the SRAM because data stored in the transistors of a memory cell is maintained during the applying of a voltage corresponding to the SRAM. Only in non-volatile memory (NVM) devices, such as an erasable programmable read-only memory (EPROM), an electrically erasable programmable ROM (EEPROM), and a flash memory, stored data can be retained even when an applied voltage is interrupted.

Today's semiconductor memory technology in general is largely based on the principle of storing charges in a material fabricated through standard complementary metal-oxide-semiconductor (CMOS) processing. The limitation of leakage current within a memory capacitor that induces charge loss or data loss in a DRAM has thus far been resolved with unsatisfactory methods such as continual refreshing of stored charges. Flash memories have the limitation to write and read cycles due to a barrier layer, and optimal solutions have not yet been found to address high voltages and slow read and write cycles.

Since a DRAM device must, in general, include as many memory cells as possible, there has been a need to raise its degree of integration by forming memory cells in the simplest way possible and in the smallest area possible. Memories used to date (NVM, flash memory, and DRAM, for example), due to their operating methods that rely on storing charges, will most likely face physical scaling limitations in the near future.

Also, there are additional limitations in flash memories and DRAMs, that is, the limitations of high switching voltage and limited read and write cycles in the flash memories, and limited retention time for stored charge in the DRAMs.

As a solution for the above limitations, a conductive bridging RAM (CBRAM) has recently been introduced, which is a memory that can store digital data through resistance switching. A CBRAM cell can be switched through a difference in electrical resistance values generated by a bipolar electrical pulse.

DISCLOSURE OF INVENTION

Technical Problem

The present invention provides methods for fabricating a silver (Ag)-doped telluride (Te)-based nano-material.

The present invention also provides nano-ionic memory devices using a silver (Ag)-doped telluride (Te)-based nano-material.

Technical Solution

Embodiments of the present invention provide a method for fabricating a silver (Ag)-doped telluride (Te)-based nano-material, the method including: preparing an ablation chamber loaded with a Te-based bulk target; generating Te-based nano-particles through radiating an energy beam from a beam generator to the bulk target; supplying a carrier gas to the ablation chamber to transfer the generated Te-based nano-particles to an annealing part having Ag particles; and forming an Ag-doped Te-based nano-material through performing a reaction between the Te-based nano-particles transferred by the carrier gas and the Ag particles included in the annealing part.

The beam generator may include one selected from the group consisting of an argon fluoride (ArF) excimer laser, a krypton fluoride (KrF) excimer laser, a xenon chloride (XeCl) excimer laser, and a Q-switched Nd:YAG laser.

The performing of the reaction between the Te-based nano-particles and the Ag particles may include performing annealing in the annealing part.

The annealing part may have a temperature ranging from a room temperature to about 1,000° C. The annealing part may have a temperature ranging from about 200° C. to about 500° C.

Pressures in the ablation chamber and the annealing part may be controlled through a pressure of the carrier gas.

A duration of the annealing performed in the annealing part may be controlled by a flow rate of the carrier gas.

The Ag-doped Te-based nano-material may include at least one selected from the group consisting of $Ag_8(Sb,As)Te_2S_3$, $(Au,Ag)_4Cu(Te,Pb)$, $AgCu_7Te_{10}$, $Ag_8(Sn,Ge)(S,Te)_6$, $Ag_4TeS$, $AgTe$, $Ag_3Cu_4Te_4$, $Ag_2Te$, $(Pd,Ag)_2Te$, $Ag_8Fe^{3+}Te_2S_4$, $(Au,Ag)Te_2$, $Ag_3HgPbSbTe_5$, $(Au,Ag)Te$, $Ag_3AuTe_2$, $Zn_6Cu_3(TeO_6)_2(OH)_6 \cdot Ag_xPb_yCl_{x+2y}$, $Ag_4Pd_3Te_4$, $Ag_7Te_4$, $(Au,Ag)_2Te_4$, $(Pd,Ag)_3(Te,Bi)$, $Ag_8(Sn,Ge)(S,Te)_6$, $Ag_9SbTe_3(S,Se)_3$, $Ag_{16}FeBiTe_3S_8$, $Pd_6AgTe_4$, and $AgBiTe_2$.

The method may further include depositing the Ag-doped Te-based nano-material on a substrate loaded on a substrate loading part. The depositing of the Ag-doped Te-based nano-material on the substrate may be formed using a vapor-liquid-solid method or a vapor-solid method. The Ag-doped Te-based nano-material may be deposited in a form of nano-particles or nano-rods.

In other embodiments of the present invention, a nano-ionic memory device includes: a substrate; a first electrode that is chemically inactive provided on the substrate; a solid electrolyte layer provided on the first electrode, and including a silver (Ag)-doped telluride (Te)-based nano-material; and a second electrode that is oxidizable provided on the solid electrolyte layer.

The first electrode may include at least one selected from the group consisting of platinum (Pt), aluminum (Al), gold (Au), titanium (Ti), tungsten (W), vanadium (V), niobium (Nb), tantalum (Ta), chrome (Cr), molybdenum (Mo), a metal nitride thereof, a metal silicide thereof, and a combination thereof.

The Ag-doped Te-based nano-material may include at least one selected from the group consisting of $Ag_8(Sb,As)Te_2S_3$, $(Au,Ag)_4Cu(Te,Pb)$, $AgCu_7Te_{10}$, $Ag_8(Sn,Ge)(S,Te)_6$, $Ag_4TeS$, $AgTe$, $Ag_3Cu_4Te_4$, $Ag_2Te$, $(Pd,Ag)_2Te$, $Ag_8Fe^{3+}Te_2S_4$, $(Au,Ag)Te_2$, $Ag_3HgPbSbTe_5$, $(Au,Ag)Te_2$, $Ag_3AuTe_2$, $Zn_6Cu_3(TeO_6)_2(OH)_6 \cdot Ag_xPb_yCl_{x+2y}$, $Ag_4Pd_3Te_4$, $Ag_7Te_4$, $(Au,Ag)_2Te_4$, $(Pd,Ag)_3(Te,Bi)$, $Ag_8(Sn,Ge)(S,Te)_6$, $Ag_9SbTe_3(S,Se)_3$, $Ag_{16}FeBiTe_3S_8$, $Pd_6AgTe_4$, and $AgBiTe_2$.

The solid electrolyte layer may include a glassy insulator. The glassy insulator may include one selected from the group consisting of $SiO_2$, $SiN$, $Si_3N_4$, $\alpha$-SiAlON, $\beta$-SiAlON, SiC, $Al_2O_3$, AlN, BeO, MgO, $TiO_2$, TiCN, $ZrO_2$, $3Al_2O_3 \cdot 2SiO_2$, and $MgAl_2O_4$.

The second electrode may include one selected from the group consisting of copper (Cu), silver (Ag), scandium Sc), manganese (Mn), iron (Fe), cobalt (Co), nickel (Ni), zinc (Zn), magnesium (Mg), calcium (Ca), and barium (Ba).

In still other embodiments of the present invention, a nano-ionic memory device include: a substrate; a first electrode that is oxidizable provided on the substrate; a solid electrolyte layer provided on the first electrode, and including conductive vias separated from one another by an interlayer dielectric, and a silver (Ag)-doped telluride (Te)-based nano-material; and a second electrode and a third electrode that are chemically inactive provided on the conductive vias and the solid electrolyte layer, respectively.

The first electrode may function as a gate electrode, and the second electrode and the third electrode may function as a source region and a drain region, respectively.

Advantageous Effects

As described above, according to the present invention, silver (Ag)-doped telluride (Te)-based nano-materials can be easily grown on general-purpose substrates using a pulsed laser ablation (PLA) and a vapor-liquid-solid (VLS) method. Accordingly, nano-ionic memory devices using the Ag-doped Te-based nano-materials can easily be provided.

MODE FOR THE INVENTION

Figure 1:
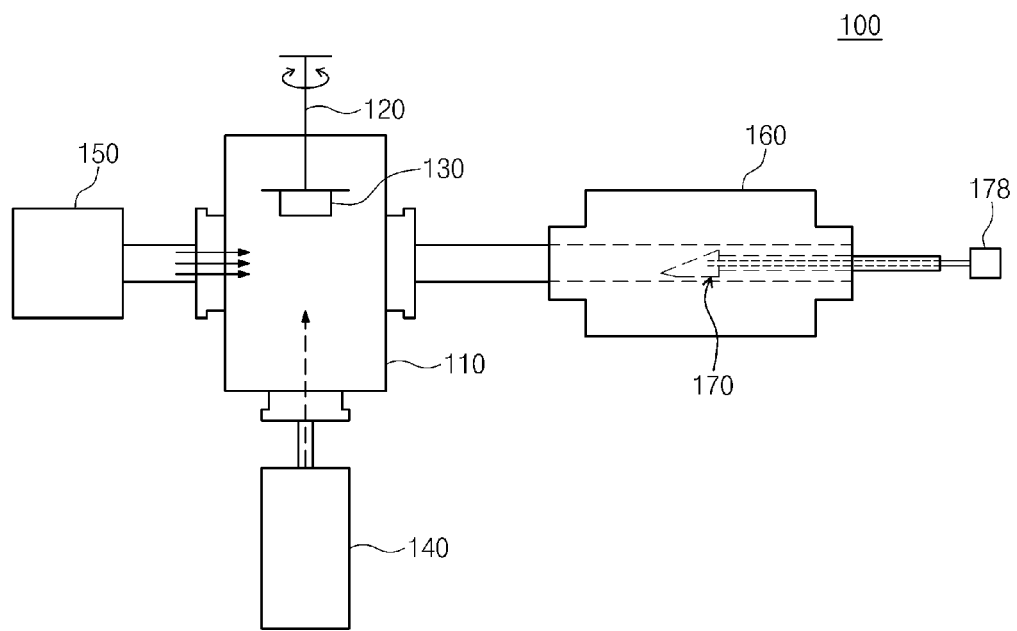
FIG. 1 is a schematic view of a fabrication system for a silver (Ag)-doped telluride (Te)-based nano-material according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Also, because preferred embodiments are provided, reference numerals that appear according to descriptive order are not necessarily limited to that order. In the figures, the dimensions of layers and regions are exaggerated for clarity of illustration. It will also be understood that when a layer (or film) is referred to as being on another layer or substrate, it can be directly or indirectly on the other layer or substrate, or intervening layers may also be present.

Figure 2:
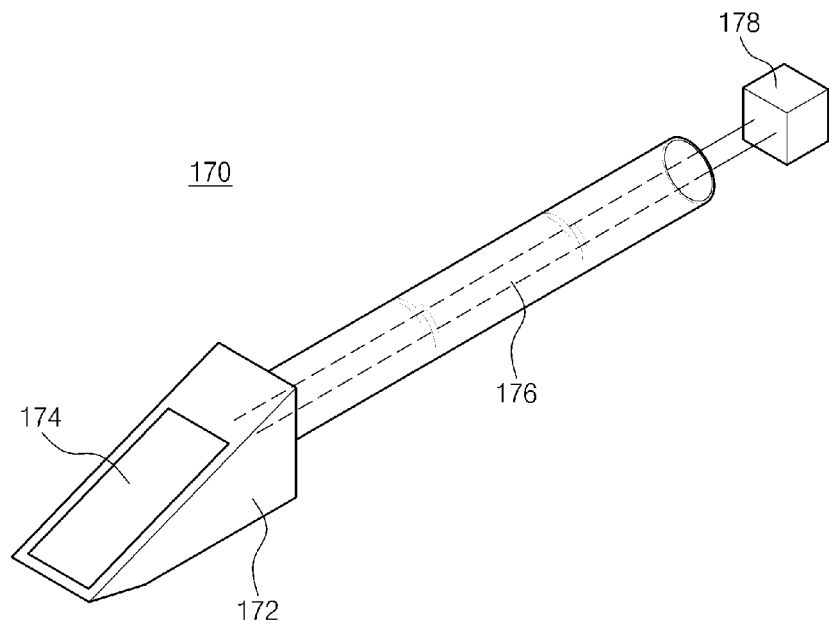
FIG. 2 is a perspective view of a substrate loading part in FIG. 1.

FIG. 1 is a schematic view of a silver (Ag)-doped telluride (Te)-based nano-material fabrication system according to an embodiment of the present invention, and FIG. 2 is a perspective view of a substrate loading part in FIG. 1.

Referring to FIGS. 1 and 2, an Ag-doped Te-based nano-material fabrication system 100 may include an ablation chamber 110, a beam generator 140, a carrier gas supplier 150, an annealing part 160, and a substrate loading part 170.

A Te-based bulk target 130 may be loaded in the ablation chamber 110. The Te-based bulk target 130 may include a Te-based metal. The ablation chamber 110 may further include a target loading part 120 for loading the Te-based bulk target 130. The target loading part 120 may further include a rotating member (indicated by the bidirectional arrow) for rotating the Te-based bulk target 130. The rotating member may be for preventing damage incurred on the Te-based bulk target 130 by an energy beam radiated from the beam generator 140. The rotating member may be a motor.

The beam generator 140 may radiate the Te-based bulk target 130 with an energy beam (depicted by the broken line arrow) to generate nano-particles. The beam generator 140 may include at least one selected from an argon fluoride (ArF) excimer laser, a krypton fluoride (KrF) excimer laser, a xenon chloride (XeCl) excimer laser, and a Q-switched Nd:YAG laser. An energy beam generated by the ArF excimer laser may have a 193 nm wavelength, a 10-40 ns pulse width, and a 1-20 Hz frequency. An energy beam generated by the KrF excimer laser may have a 248 nm wavelength, a 10-40 ns pulse width, and a 1-20 Hz frequency. An energy beam generated by the XeCl excimer laser may have a 308 nm wavelength, a 10-40 ns pulse width, and a 1-20 Hz frequency. An energy beam generated by the Q-switched Nd:YAG laser may have a 266 nm, 355 nm, 532 nm, and 1064 nm wavelength, a 10-40 ns pulse width, and a 1-20 Hz frequency. Preferably, an energy beam generated by the beam generator 140 may be a pulse laser beam having a 193 nm wavelength, a 20 ns pulse width, and a 5 Hz frequency. The beam generator 140 may be disposed in a position such that the direction of travel of an energy beam it radiates forms a substantially straight line with the Te-based bulk target 130.

The carrier gas supplier 150 may supply a carrier gas (depicted by the unbroken arrows) to the ablation chamber 110 in order to transfer the Te-based nano-particles generated through energy beam radiation. The carrier gas may include an inactive gas or nitrogen gas ($N_2$). The carrier gas may further include oxygen gas ($O_2$). This oxygen gas may function to increase reactivity of the Te-based nano-particles. The pressure of the ablation chamber 110 and the annealing part 160 may be controlled by the pressure of the carrier gas. Through the flow rate of the carrier gas, annealing time for a reaction between the Te-based nano-particles and Ag particles may be controlled. The carrier gas supplier 150 may be disposed in a position substantially perpendicular to a straight line connecting the Te-based bulk target 130 and the beam generator 140 (or, the direction of travel of the energy beam).

The annealing part 160 may induce a reaction through heating, between the Te-based nano-particles transferred by the carrier gas and the Ag particles included in the annealing part 160, to form an Ag-doped Te-based nano-material. The annealing part 160 may be a furnace. The Ag particles that react with the Te-based nano-particles in the annealing part 160 may be formed through annealing of Ag pre-supplied into the annealing part 160 through heating performed by the annealing part 160. The annealing part 160 may be disposed in a position on a straight line formed with the carrier gas supplier 150 (that is, substantially perpendicular to the direction of travel of the energy beam). The annealing part 160 and the carrier gas supplier 150 may be disposed at mutually opposite positions with respect to the energy beam.

The substrate loading part 170 may load a substrate (not shown) on which are deposited the Ag-doped Te-based nano material formed through reaction of the Te-based nano-particles and the Ag particles. The substrate loading part 170 may include a loading head 172 including a substrate loading surface 174, and a loading body 176 connected to the loading head 172. The loading head 172 may include silicon carbide (SiC). The loading body 176 may be a quartz tube. The substrate may be a flat substrate or a linear substrate. The flat substrate may be a circular substrate or a rectangular substrate, and the linear substrate may be a substrate formed with tips. The substrate loading part 170 may further include a temperature sensing device 178 for sensing a temperature of the substrate. To accurately measure the temperature of the substrate, the temperature sensing device 178 may measure the temperatures of the substrate loading surface 174 and the loading head 172. The temperature sensing device 178 may be a device including a thermocouple. The thermocouple may be inserted through the quartz tube loading body 176 to sense the temperatures of the substrate loading surface 174 and the loading head 172.

By using the Ag-doped Te-based nano-material fabrication system 100, the Ag-doped Te-based nano-materials may be deposited on the substrate to grow nano-particles or nano-rods (or nano-wires). Ag-doped Te-based nano-particles or nano-rods may include at least one selected from benleonardite ($Ag_8(Sb,As)Te_2S_3$), bersmertnovite (($Au,Ag)_4Cu(Te,Pb)$), cameronite ($AgCu_7Te_{10}$), canfieldite ($Ag_8(Sn,Ge)(S,Te)_6$), cervelleite ($Ag_4TeS$), empressite (AgTe), Henryite ($Ag_3Cu_4Te_4$), Hessite ($Ag_2Te$), IMA1993-062 (($Pd,Ag)_2Te$), IMA2004-042a ($Ag_8Fe^{3+}Te_2S_4$), krennerite (($Au,Ag)Te_2$), mazzettiite ($Ag_3HgPbSbTe_5$), muthmannite ((Au,Ag)Te), petzite ($Ag_3AuTe_2$), quetzalcoatlite ($Zn_6Cu_3(TeO_6)_2(OH)_6 \cdot Ag_xPb_yCl_{x+2y}$), sopcheite ($Ag_4Pd_3Te_4$), stutzite ($Ag_7Te_4$), sylvanite (($Au,Ag)_2Te_4$), telargpalite (($Pd,Ag)_3(Te,Bi)$), tellurian canfieldite ($Ag_8(Sn,Ge)(S,Te)_6$), tsnigtiite ($Ag_9SbTe_3(S,Se)_3$), 'unnamed (Ag—Fe—Bi telluride sulfide)' ($Ag_{16}FeBiTe_3S_s$), 'unnamed (PdAg telluride)' ($Pd_6AgTe_4$), and volynskite ($AgBiTe_2$).

Figure 3:
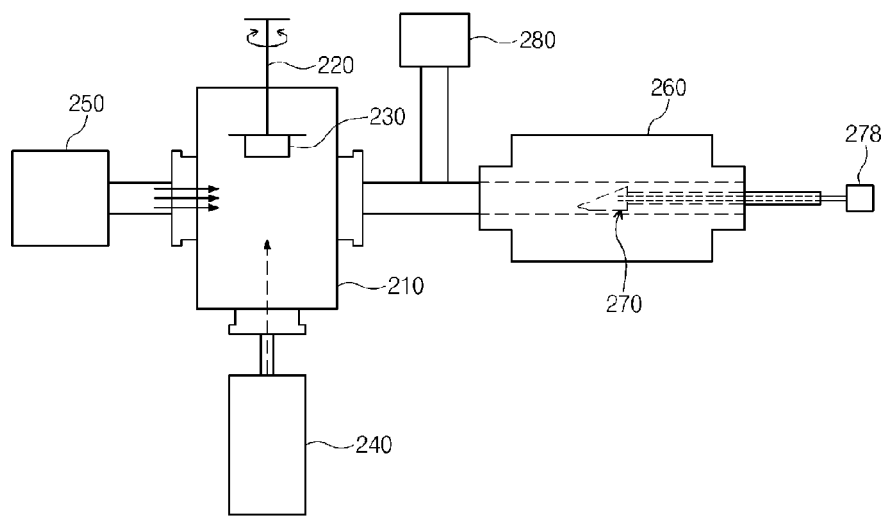
FIG. 3 is a schematic view of a fabrication system for a Ag-doped Te-based nano-material according to another embodiment of the present invention.

FIG. 3 is a schematic view of a silver (Ag)-doped telluride (Te)-based nano-material fabrication system according to another embodiment of the present invention.

Referring to FIG. 3, an Ag-doped Te-based nano-material fabrication system 200 may include an ablation chamber 210, a beam generator 240, a carrier gas supplier 250, a reaction material supplier 280, an annealing part 260, and a substrate loading part 270.

The ablation chamber 210 may have a Te-based bulk target 230 mounted therein. The Te-based bulk target 230 may include a Te-based metal. The ablation chamber 210 may further include a target loading part 220 for loading the Te-based bulk target 230. The target loading part 220 may further include a rotating member (depicted by the bidirectional arrow) for rotating the Te-based bulk target 230. The rotating member may be for preventing damage to the Te-based bulk target 230 from an energy beam generated by the beam generator 240. The rotating member may be a motor.

The beam generator 240 may radiate the Te-based bulk target 230 with an energy beam (depicted by the broken line arrow) to generate Te-based nano-particles. The beam generator 240 may include at least one selected from an ArF excimer laser, a KrF excimer laser, an XeCl excimer laser, and a Q-switched Nd:YAG laser. An energy beam generated by the ArF excimer laser may have a 193 nm wavelength, a 10-40 ns pulse width, and a 1-20 Hz frequency. An energy beam generated by the KrF excimer laser may have a 248 nm wavelength, a 10-40 ns pulse width, and a 1-20 Hz frequency. An energy beam generated by the XeCl excimer laser may have a 308 nm wavelength, a 10-40 ns pulse width, and a 1-20 Hz frequency. An energy beam generated by the Q-switched Nd:YAG laser may have a 266 nm, 355 nm, 532 nm, and 1064 nm wavelength, a 10-40 ns pulse width, and a 1-20 Hz frequency. Preferably, an energy beam generated by the beam generator 240 may be a pulse laser beam having a 193 nm wavelength, a 20 ns pulse width, and a 5 Hz frequency. The beam generator 240 may be disposed in a position such that the direction of travel of an energy beam it discharges forms a substantially straight line with the Te-based bulk target 230.

The carrier gas supplier 250 may supply a carrier gas (depicted by the unbroken arrows) to the ablation chamber 210 in order to transfer the Te-based nano-particles generated through energy beam radiation. The carrier gas may include an inactive gas or nitrogen gas ($N_2$). The carrier gas may further include oxygen gas ($O_2$). This oxygen gas may function to increase reactivity of the Te-based nano-particles. The pressure of the ablation chamber 210 and the annealing part 260 may be controlled by the pressure of the carrier gas. Through the flow rate of the carrier gas, annealing time for a reaction between the Te-based nano-particles and Ag particles may be controlled. The carrier gas supplier 250 may be disposed in a position substantially perpendicular to a straight line connecting the Te-based bulk target 230 and the beam generator 240 (or, the direction of travel of the energy beam).

The reactive material supplier 280 may supply Ag particles (reactive material) that react with the Te-based nano-particles to form an Ag-doped Te-based nano-material. The reactive material supplier 280 may be disposed in a position to supply reactive material between the ablation chamber 210 and annealing part 260. The reactive material supplier 280 may further provide a reactive material carrier gas to convey reactive material. The reactive material carrier gas may include a non-volatile gas or nitrogen gas. The Ag particles that react with the Te-based nano-particles in the annealing part 260 may be provided from the reactive material supplier 280 to the annealing part 260 via the reaction material carrier gas.

The annealing part 260 may induce a reaction through heating, between the Te-based nano-particles transferred by the carrier gas and the Ag particles (reactive material) transferred by the reactive material carrier gas, to form the Ag-doped Te-based nano-material. The annealing part 260 may be a furnace. The annealing part 260 may be disposed in a position on a straight line formed with the carrier gas supplier 250 (that is, substantially perpendicular to the direction of travel of the energy beam). The annealing part 260 and the carrier gas supplier 250 may be disposed at mutually opposite positions with respect to the energy beam.

The substrate loading part 270 may load a substrate (not shown) on which are deposited the Ag-doped Te-based nano-material formed through reaction of the Te-based nano-particles and the Ag particles. The substrate may be a flat substrate or a linear substrate. The flat substrate may be a circular substrate or a rectangular substrate, and the linear substrate may be a substrate formed with tips. The substrate loading part 270 may further include a temperature sensing device 278 for sensing a temperature of the substrate. To accurately measure the temperature of the substrate, the temperature sensing device 278 may measure the temperatures of a substrate loading surface (see reference numeral 174 in FIG. 2) and a loading head (see reference numeral 172 in FIG. 2). The temperature sensing device 278 may be a device including a thermocouple. The thermocouple may be inserted through a quartz tube loading body (see reference numeral 176 in FIG. 2) to sense the temperatures of the substrate loading surface and the loading head.

By using the Ag-doped Te-based nano-material fabrication system 200, the Ag-doped Te-based nano-materials may be deposited on the substrate to grow nano-particles or nano-rods. Ag-doped Te-based nano-particles or nano-rods may include at least one selected from benleonardite ($Ag_8(Sb,As)Te_2S_3$), bersmertnovite (($Au,Ag)_4Cu(Te,Pb)$), cameronite ($AgCu_7Te10$), canfieldite ($Ag_8(Sn,Ge)(S,Te)_6$), cervelleite ($Ag_4TeS$), empressite ($AgTe$), Henryite ($Ag_3Cu_4Te_4$), Hessite ($Ag_2Te$), IMA1993-062 (($Pd,Ag)_2Te$), IMA2004-042a ($Ag_8Fe^{3+}Te_2S_4$), krennerite (($Au,Ag)Te_2$), mazzettiite ($Ag_3HgPbSbTe_5$), muthmannite (($Au,Ag)Te$), petzite ($Ag_3AuTe_2$), quetzalcoatlite ($Zn_6Cu_3(TeO_6)_2(OH)_6 \cdot Ag_xPb_y\text{-}Cl_{x+2y}$), sopcheite ($Ag_4Pd_3Te_4$), stutzite ($Ag_7Te_4$), sylvanite (($Au,Ag)_2Te_4$), telargpalite (($Pd,Ag)_3(Te,Bi)$), tellurian canfieldite ($Ag_8(Sn,Ge)(S,Te)_6$), tsnigtiite ($Ag_9SbTe_3(S,Se)_3$), 'unnamed (Ag—Fe—Bi telluride sulfide)' ($Ag_{16}FeBiTe_3S_8$), 'unnamed (PdAg telluride)' ($Pd_6AgTe_4$), and volynskite ($AgBiTe_2$).

Figure 4:
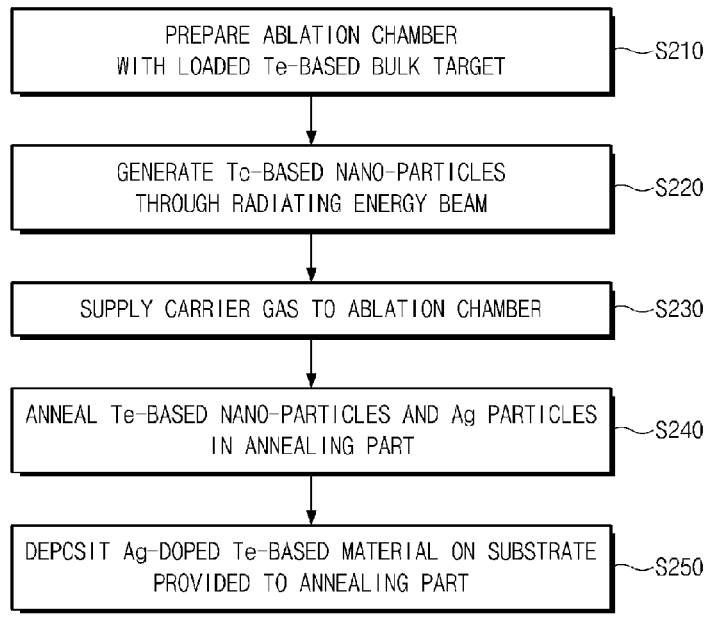
FIG. 4 is a process flowchart of a fabrication method of a Ag-doped Te-based nano-material according to embodiments of the present invention.

FIG. 4 is a process flowchart of a fabrication method of a silver (Ag)-doped telluride (Te)-based nano-material according to embodiments of the present invention.

Referring to FIG. 4, an ablation chamber having a Te-based bulk target loaded therein is prepared in operation S210. The Te-based bulk target may include a Te-based metal or an Ag-doped Te-based metal. Such the Te-based bulk target may be used to form an electrolyte layer used in a nano-ionic memory device. The ablation chamber may further include a target loading part for loading the Te-based bulk target.

The target loading part may further include a rotating member for rotating the Te-based bulk target. The rotating member may be for preventing damage to the Te-based bulk target from an energy beam generated by a beam generator. The rotating member may be a motor.

The beam generator radiates the energy beam onto the Te-based bulk target to generate Te-based nano-particles in operation S220. If the Te-based bulk target is the Ag-doped Te-based metal, Ag-doped Te-based nano-particles may be generated. The beam generator may include at least one selected from an ArF excimer laser, a KrF excimer laser, an XeCl excimer laser, and a Q-switched Nd:YAG laser. An energy beam generated by the ArF excimer laser may have a 193 nm wavelength, a 10-40 ns pulse width, and a 1-20 Hz frequency. An energy beam generated by the KrF excimer laser may have a 248 nm wavelength, a 10-40 ns pulse width, and a 1-20 Hz frequency. An energy beam generated by the XeCl excimer laser may have a 308 nm wavelength, a 10-40 ns pulse width, and a 1-20 Hz frequency. An energy beam generated by the Q-switched Nd:YAG laser may have a 266 nm, 355 nm, 532 nm, and 1064 nm wavelength, a 10-40 ns pulse width, and a 1-20 Hz frequency. Preferably, the energy beam generated by the beam generator may be a pulse laser beam having a 193 nm wavelength, a 20 ns pulse width, and a 5 Hz frequency. When the energy beam is radiated onto the Te-based bulk target, the Te-based nano-particles generated on the surface of the Te-based bulk target may cause a plume with an elliptical section.

A carrier gas is provided in the ablation chamber in operation S230. The provided carrier gas may transfer the generated Te-based nano-particles. The carrier gas may include non-volatile gas or nitrogen gas. Preferably, the carrier gas may be a non-volatile argon gas.

The Te-based nano-particles transferred by the carrier gas and Ag particles are annealed in an annealing part in operation S240. Through the annealing, the Te-based nano-particles and the Ag particles may react with one another to form an Ag-doped Te-based nano-material. The Ag particles may be generated through annealing in the annealing part of Ag pre-supplied into the annealing part, or may be provided to the annealing part by a reactive material supplier (see reference numeral 280 in FIG. 3).

Pressures of the ablation chamber and the annealing part may be controlled by a pressure of the carrier gas, and the pressure may range between about 0.1 and about 10 torr. Preferably, the pressure may range between about 3.0 and 4.0 torr. The flow rate of the carrier gas may control the annealing time for reacting the Te-based nano-particles and the Ag particles, and the flow rate may range between about 1 and about 2,000 cc/min. Preferably, the flow rate may range between about 500 and 900 cc/min.

The annealing part may heat the carrier gas to a range between a room temperature and about 1,000° C. The raising of the annealing part to a temperature ranging from a room temperature to about 1,000° C. may be to melt the Ag pre-supplied into the annealing part and generate the Ag particles. Accordingly, when the silver particles are supplied from the reactive material supplier, the annealing part may be configured to have a temperature ranging from a room temperature to about 700° C. Preferably, the annealing part may give the carrier gas a temperature ranging from about 200 to about 500° C. After the Te-based nano-particles and the Ag particles react with one another to form an Ag-doped Te-based nano-material in a temperature ranging from a room temperature to about 500° C. or higher, the Ag-doped Te-based nano-material may be deposited in a temperature of about 200° C. or lower. When the Te-based bulk target is the Ag-doped Te-based metal, the annealing part may give carrier gas a temperature ranging from about 100 to about 300° C.

In operation S250, the Ag-doped Te-based nano-material (formed through reaction between the Te-based nano-particles transferred by the carrier gas and the Ag particles included in the annealing part) is deposited on a substrate provided in the annealing part. The Ag-doped Te-based nano-material may be deposited on the substrate through a vaporliquid-solid (VLS) method or a vapor-solid method. The VLS method is a typical method for forming nano-rods. In the present invention, the Ag-doped Te-based nano-material may be directly deposited on the substrate without undergoing the liquid phase of the VLS method. The substrate may be a flat substrate or a linear substrate. The flat substrate may be round or rectangular, and the linear substrate may be a substrate formed with tips.

Accordingly, the Ag-doped Te-based nano-material may be deposited on the substrate through the vapor-solid method or the VLS method, to grow nano-particles or nano-rods. The amount of growth of Ag-doped Te-based nano-particles or nano-rods may be controlled by the deposition time. The Ag-doped Te-based nano-particles or nano-rods may include at least one selected from benleonardite ($Ag_8(Sb,As)Te_2S_3$), bersmertnovite (($Au,Ag)_4Cu(Te,Pb)$), cameronite ($AgCu_7Te_{10}$), canfieldite ($Ag_8(Sn,Ge)(S,Te)_6$), cervelleite ($Ag_4TeS$), empressite (AgTe), Henryite ($Ag_3Cu_4Te_4$), Hessite ($Ag_2Te$), IMA1993-062 (($Pd,Ag)_2Te$), IMA2004-042a ($Ag_8Fe^{3+}Te_2S_4$), krennerite (($Au,Ag)Te_2$), mazzettiite ($Ag_3HgPbSbTe_5$), muthmannite (($Au,Ag)Te$), petzite ($Ag_3AuTe_2$), quetzalcoatlite ($Zn_6Cu_3(TeO_6)_2(OH)_6 \cdot Ag_xPb_y Cl_{x+2y}$), sopcheite ($Ag_4Pd_3Te_4$), stutzite ($Ag_7Te_4$), sylvanite (($Au,Ag)_2Te_4$), telargpalite (($Pd,Ag)_3(Te,Bi)$), tellurian canfieldite ($Ag_8(Sn,Ge)(S,Te)_6$), tsnigtiite ($Ag_9SbTe_3(S,Se)_3$), 'unnamed (Ag—Fe—Bi telluride sulfide)' ($Ag_{16}FeBiTe_3S_8$), 'unnamed (PdAg telluride)' ($Pd_6AgTe_4$), and volynskite ($AgBiTe_2$).

Figure 5:
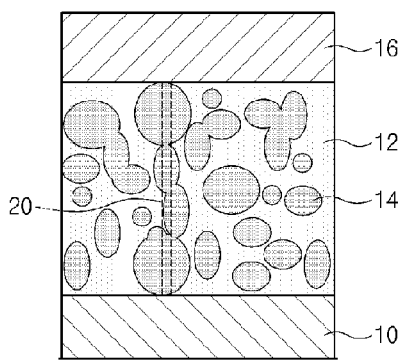
FIGS. 5 and 6 are sectional views for describing operational characteristics of a nano-ionic memory device.
Figure 6:
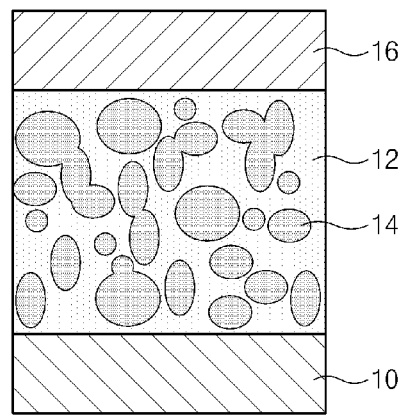

FIGS. 5 and 6 are sectional views for describing operational characteristics of a nano-ionic memory device.

Referring to FIGS. 5 and 6, a nano-ionic memory device (or a programmable-metalization-cell memory (PMCm) device) may fundamentally include a lower electrode 10, an upper electrode 16, and a solid electrolyte layer 12 interposed in between. The lower electrode 10 may include a chemically inactive conductive material, and the upper electrode may include an oxidizable conductive material. The solid electrolyte layer 12 may include a glassy insulator and a superionic region 14. The superionic region 14 may be Ag-doped Te-based nano-particles or nano-rods according to embodiments of the present invention.

When a voltage greater than a threshold voltage is applied to the upper electrode 16, metal ions (positively-charged ions) extracted from the oxidizable upper electrode 16 and electrons (negatively-charged ions) provided from the lower electrode 10 may attach to the superionic region 14 to form metal atoms. These metal atoms may adjoin to form a connected belt cluster. The cluster may form a conductive bridge 20 that is a virus-sized filament electrically connecting the lower electrode 10 and the upper electrode 16. The conductive bridge 20 may provide a channel that is a path for when a current flows through the nano-ionic memory device. When a voltage greater than a threshold voltage is applied to the lower electrode 10, the conductive bridge 20 that was formed between the lower electrode 10 and the upper electrode 16 may be dissolved.

Accordingly, the solid electrolyte layer 12 may assume a high resistance state (see FIG. 6) and a low resistance state (see FIG. 5), and these resistances of the solid electrolyte layer 12 may be used to store values of '0' and '1'. Because the solid electrolyte layer 12 includes the superionic region 14 configured with the Ag-doped Te-based nano-particles or nanorods, conversion between resistance states can occur in nanoseconds (ns). Also, the nano-ionic memory device can have non-volatile characteristics because the conductive bridge 20 exists until it is dissolved by a reverse voltage. That is, the nano-ionic memory device is a type of resistive RAM (RRAM) device.

Figure 7:
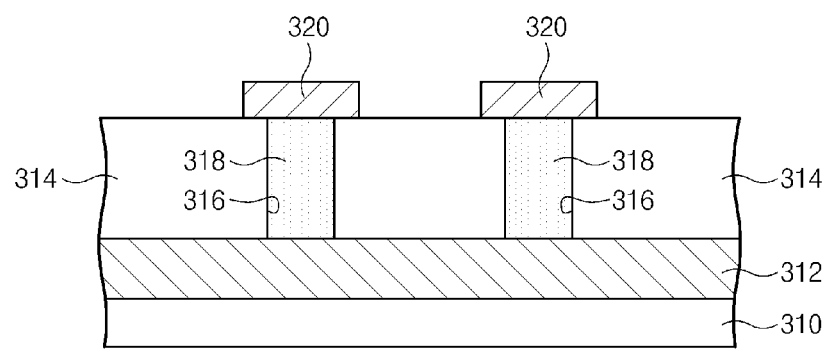
FIGS. 7 and 8 are sectional views of nano-ionic memory devices including a Ag-doped Te-based nano-material according to embodiments of the present invention.
Figure 8:
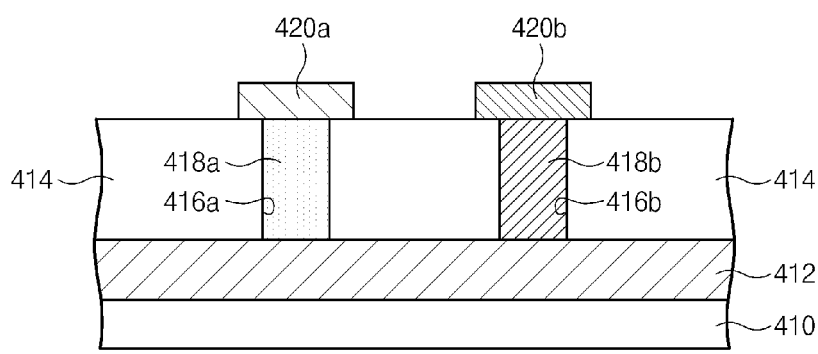

FIGS. 7 and 8 are sectional views of nano-ionic memory devices including a silver (Ag)-doped telluride (Te)-based nano-material according to embodiments of the present invention.

Referring to FIG. 7, a nano-ionic memory device may include a substrate 310, a lower electrode 312, an electrolyte layer 318, and upper electrodes 320.

The substrate 310 may be a general purpose substrate such as a Si substrate. The lower electrode 312 provided on the substrate 310 may include a chemically inactive conductive material. The chemically inactive conductive material may include at least one selected from platinum (Pt), aluminum (Al), gold (Au), titanium (Ti), tungsten (W), vanadium (V), niobium (Nb), tantalum (Ta), chrome (Cr), molybdenum (Mo), metal nitrides of the above, metal silicides of the above, and compounds of the above.

The electrolyte layers 318 provided on the lower electrode 312 may include a solid electrolyte material including Ag-coped Te-based nano-particles or nano-rods. The solid electrolyte material may include a glassy insulator. The glassy insulator may include one selected from $SiO_2$, SiN, $Si_3N_4$, α-SiAlON, β-SiAlON, SiC, $Al_2O_3$, AlN, BeO, MgO, $TiO_2$, TiCN, $ZrO_2$, $3Al_2O_3 \cdot 2SiO_2$, and $MgAl_2O_4$. The Ag-doped Te-based nano-particles or nano-rods may include at least one selected from $Ag_8(Sb,As)Te_2S_3$, $(Au,Ag)_4Cu(Te,Pb)$, $AgCu_7Te_{10}$, $Ag_8(Sn,Ge)(S,Te)_6$, $Ag_4TeS$, AgTe, $Ag_3Cu_4Te_4$, $Ag_2Te$, $(Pd,Ag)_2Te$, $Ag_8Fe^{3+}Te_2S_4$, $(Au,Ag)Te_2$, $Ag_3HgPbSbTe_5$, $(Au,Ag)Te$, $Ag_3AuTe_2$, $Zn_6Cu_3(TeO_6)_2(OH)_6 \cdot Ag_xPb_yCl_{x+2y}$, $Ag_4Pd_3Te_4$, $Ag_7Te_4$, $(Au,Ag)_2Te_4$, $(Pd,Ag)_3(Te,Bi)$, $Ag_8(Sn,Ge)(S,Te)_6$, $Ag_9SbTe_3(S,Se)_3$, $Ag_{16}FeBiTe_3S_8$, $Pd_6AgTe_4$, and $AgBiTe_2$.

The electrolyte layers 318 may be provided respectively in openings 316 included in an interlayer dielectric 314. The upper electrodes 320 provided on the electrolyte layers 318, respectively, may include an oxidizable conductive material. The oxidizable conductive material may include one selected from copper (Cu), silver (Ag), scandium (Sc), manganese (Mn), iron (Fe), cobalt (Co), nickel (Ni), zinc (Zn), magnesium (Mg), calcium (Ca), and barium (Ba).

As described above with reference to FIGS. 5 and 6, when a voltage greater than a threshold voltage is applied to the upper electrodes 320, metal ions (positively-charged ions) extracted from the upper electrodes 320 and electrons (negatively-charged ions) provided from the lower electrode 312 may attach to the Ag-doped Te-based nano-particles or nano-rods included in the electrolyte layers 318 to form metal atoms. The metal atoms may adjoin to form a connected belt cluster. The cluster may form a conductive bridge that is a virus-sized filament electrically connecting the lower electrode 312 and the upper electrodes 320. The conductive bridge may provide a channel that is a path enabling a current to flow through the nano-ionic memory device. When a voltage greater than a threshold voltage is applied to the lower electrode 312, the conductive bridge that was formed between the lower electrode 312 and the upper electrodes 320 may be dissolved.

Accordingly, the electrolyte layer 318 may have a high resistance state and a low resistance state, and these resistances of the electrolyte layer 318 may be used to store data values of '0' or/and '1' according to the resistivity of each memory cell.

Referring to FIG. 8, a nano-ionic memory device may include a substrate 410, a first electrode 412, a second electrode 420a, a third electrode 420b, an interlayer dielectric 414, and an electrolyte layer 418a and a conductive via 418b included therein.

The substrate 410 may be a general-purpose substrate such as a Si substrate. The first electrode 412 provided on the substrate 410 may include an oxidizable conductive material. The electrolyte layer 418a provided on the first electrode 412 may include a solid electrolyte material including Ag-doped Te-based nano-particles or nano-rods, and the conductive via 418b may include a conductive metal. The electrolyte layer 418a and the conductive via 418b may be provided in an opening 416a and a via hole 416b, respectively, that are provided space apart from one another in the interlayer dielectric 414. The second electrode 420a and the third electrode 420b provided on the electrolyte layer 418a and the conductive via 418b, respectively, may include a chemically inactive conductive metal. The conductive via 418b, the second electrode 420a, and the third electrode 420b may be formed of the same material.

Similar to the description above with reference to FIGS. 5 and 6, when a voltage greater than a threshold voltage is applied to the first electrode 412, metal ions (positively-charged ions) extracted from the first electrode 412 and electrons (negatively-charged ions) provided by the second electrode 420a may attach to the Ag-doped Te-based nano-particles or nano-rods included in the electrolyte layer 418a to form metal atoms. The metal atoms may adjoin to form a connected belt cluster. The cluster may form a conductive bridge that is a virus-sized filament electrically connecting the first electrode 412 and the second electrode 420a. The conductive bridge may provide a channel that is a path enabling a current to flow between the second electrode 420a and the third electrode 420b. When a voltage greater than a threshold voltage is applied to the first electrode 412, the conductive bridge that was formed between the first electrode 412 and the second electrode 420a may be dissolved.

Accordingly, the electrolyte layer 418a can have a high resistance state and a low resistance state, and by using the resistances of the electrolyte layer 418a, the nano-ionic memory device may perform an operation similar to a field effect transistor. Here, the first electrode 412 may function as a gate electrode, and the second electrode 420a and the third electrode 420b may function as a source region and a drain region, respectively.

Because the above-described methods according to embodiments of the present invention can easily grow an Ag-doped Te-based nano-material on general-purpose substrates, a wide variety of nano-ionic memory devices using the Ag-doped Te-based nano-material can be fabricated.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A vapor-solid method of fabricating a silver (Ag)-doped telluride (Te)-based nano-material, the method comprising:
   preparing an ablation chamber loaded with a Te-based bulk target;
   generating Te-based nano-particles through radiating an energy beam from a beam generator to the bulk target;
   supplying a carrier gas to the ablation chamber to transfer the generated Te-based nano-particles to an annealing part having Ag particles, wherein the Ag particles are formed through annealing of Ag pre-supplied in the annealing part;
   forming an Ag-doped Te-based nano-material through performing a reaction between the Te-based nano-particles transferred by the carrier gas and the Ag particles included in the annealing part and
   depositing the Ag-doped Te-based nano-material on a substrate loaded on a substrate loading part.

2. The method of claim 1, wherein the beam generator comprises one selected from the group consisting of an argon fluoride (ArF) excimer laser, a krypton fluoride (KrF) excimer laser, a xenon chloride (XeCl) excimer laser, and a Q-switched Nd:YAG laser.

3. The method of claim 1, wherein the performing of the reaction between the Te-based nano-particles and the Ag particles comprises performing annealing in the annealing part.

4. The method of claim 1, wherein the annealing part has a temperature ranging from a room temperature to about 1,000° C.

5. The method of claim 4, wherein the annealing part has a temperature ranging from about 200° C. to about 500° C.

6. The method of claim 1, wherein pressures in the ablation chamber and the annealing part are controlled through a pressure of the carrier gas.

7. The method of claim 3, wherein a duration of the annealing performed in the annealing part is controlled by a flow rate of the carrier gas.

8. The method of claim 1, wherein the Ag-doped Te-based nano-material comprises at least one selected from the group consisting of $Ag_8(Sb,As)Te_2S_3$, $(Au,Ag)_4Cu(Te,Pb)$, $AgCu_7Te_{10}$, $Ag_8(Sn,Ge)(S,Te)_6$, $Ag_4TeS$, $AgTe$, $Ag_3Cu_4Te_4$, $Ag_2Te$, $(Pd,Ag)_2Te$, $Ag_8Fe^{3+}Te_2S_4$, $(Au,Ag)Te_2$, $Ag_3HgPbSbTe_5$, $(Au,Ag)Te$, $Ag_3AuTe_2$, $Zn_6Cu_3(TeO_6)_2(OH)_6 \cdot Ag_xPb_yCl_{x+2y}$, $Ag_4Pd_3Te_4$, $Ag_7Te_4$, $(Au,Ag)_2Te_4$, $(Pd,Ag)_3(Te,Bi)$, $Ag_8(Sn,Ge)(S,Te)_6$, $Ag_9SbTe_3(S,Se)_3$, $Ag_{16}FeBiTe_3S_8$, $Pd_6AgTe_4$, and $AgBiTe_2$.

9. The method of claim 7, wherein the Ag-doped Te-based nano-material is deposited in a form of nano-particles or nano-rods.

10. A vapor-solid method of fabricating a silver (Ag)-doped telluride (Te)-based nano-material, the method comprising:
    preparing an ablation chamber loaded with a Te-based bulk target;
    generating Te-based nano-particles through radiating an energy beam from a beam generator to the bulk target;
    supplying a first carrier gas to the ablation chamber to transfer the generated Te-based nano-particles to an annealing part having Ag particles;
    reacting the Ag particles with the Te-based nano-particles in the annealing part, thereby generating Ag-doped Te-based nano-material;
    supplying a second carrier gas to the annealing part to transfer the generated Ag-doped Te-based nano-material to a substrate loading chamber; and
    depositing the Ag-doped Te-based nano-material on a substrate loaded on a substrate loading part.

* * * * *